United States Patent
Icelli et al.

(10) Patent No.: US 10,424,753 B2
(45) Date of Patent: Sep. 24, 2019

(54) USAGE OF BORIC ACID IN THE PRODUCTION OF PEDOT:PSS FILM

(71) Applicants: Orhan Icelli, Esenler/Istanbul (TR); Serap Gunes, Esenler/Istanbul (TR); Sureyya Aydin Yuksel, Esenler/Istanbul (TR); Serco Serkis Yesilkaya, Esenler/Istanbul (TR); Ozlem Yagci, Esenler/Istanbul (TR)

(72) Inventors: Orhan Icelli, Esenler/Istanbul (TR); Serap Gunes, Esenler/Istanbul (TR); Sureyya Aydin Yuksel, Esenler/Istanbul (TR); Serco Serkis Yesilkaya, Esenler/Istanbul (TR); Ozlem Yagci, Esenler/Istanbul (TR); Mustafa Okutan, Esenler/Istanbul (TR); Fatih Ongul, Esenler/Istanbul (TR); Sinem Bozar, Esenler/Istanbul (TR)

(73) Assignees: Orhan Icelli, Esenler/Istanbul (TR); Serap Gunes, Esenler/Istanbul (TR); Sureyya Aydin Yuksel, Esenler/Istanbul (TR); Serco Serkis Yesilkaya, Esenler/Istanbul (TR); Ozlem Yagci, Esenler/Istanbul (TR)

(*) Notice: Subject to any disclaimer, the term of this patent is extended or adjusted under 35 U.S.C. 154(b) by 0 days.

(21) Appl. No.: 15/766,003

(22) PCT Filed: Oct. 19, 2016

(86) PCT No.: PCT/TR2016/050389
§ 371 (c)(1),
(2) Date: Apr. 5, 2018

(87) PCT Pub. No.: WO2017/069716
PCT Pub. Date: Apr. 27, 2017

(65) Prior Publication Data
US 2018/0287083 A1    Oct. 4, 2018

(30) Foreign Application Priority Data

Oct. 19, 2015 (TR) ............................ a 2015 08718

(51) Int. Cl.
*H01B 1/12* (2006.01)
*H01L 51/44* (2006.01)
(Continued)

(52) U.S. Cl.
CPC .............. *H01L 51/442* (2013.01); *C09D 5/24* (2013.01); *C09D 141/00* (2013.01); *H01B 1/127* (2013.01);
(Continued)

(58) Field of Classification Search
CPC ... H02L 51/442; H02L 51/506; H01L 51/442; H01L 51/506; H01B 1/127
See application file for complete search history.

(56) References Cited

U.S. PATENT DOCUMENTS

2008/0123252 A1* 5/2008 Kasuga ................ H01G 9/0036
361/525
2009/0301556 A1* 12/2009 Kawano ................ B82Y 10/00
136/256

* cited by examiner

*Primary Examiner* — Daniel P Shook
(74) *Attorney, Agent, or Firm* — Andrew Malarz, Esq.

(57) ABSTRACT

The invention relates to production method of PEDOT:PSS film which comprises the steps of preparing substrate, preparing the mixture of boric acid doped PEDOT:PSS prepare on the substrate surface.

4 Claims, 2 Drawing Sheets

(51) Int. Cl.
*H01L 51/00* (2006.01)
*C09D 5/24* (2006.01)
*C09D 141/00* (2006.01)
*H01L 51/50* (2006.01)

(52) U.S. Cl.
CPC ........ *H01L 51/0037* (2013.01); *H01L 51/506* (2013.01); *Y02E 10/549* (2013.01)

USAGE OF BORIC ACID IN THE PRODUCTION OF PEDOT:PSS FILM

TECHNICAL FIELD

The invention is related to the improvement of the conductivity, morphology and stability of the poly(3,4-ethylenedioxythiophene):poly(styrenesulfonate) (PEDOT:PSS) films which are used in many areas particularly such as electronical, optical, electrochemical and biomedical applications.

The invention is related to obtaining application results with higher efficiency in all areas in which PEDOT:PSS film is used especially by doping PEDOT:PSS film with boric acid which is quite low cost and easily processable.

PRIOR ART

Figure 1:
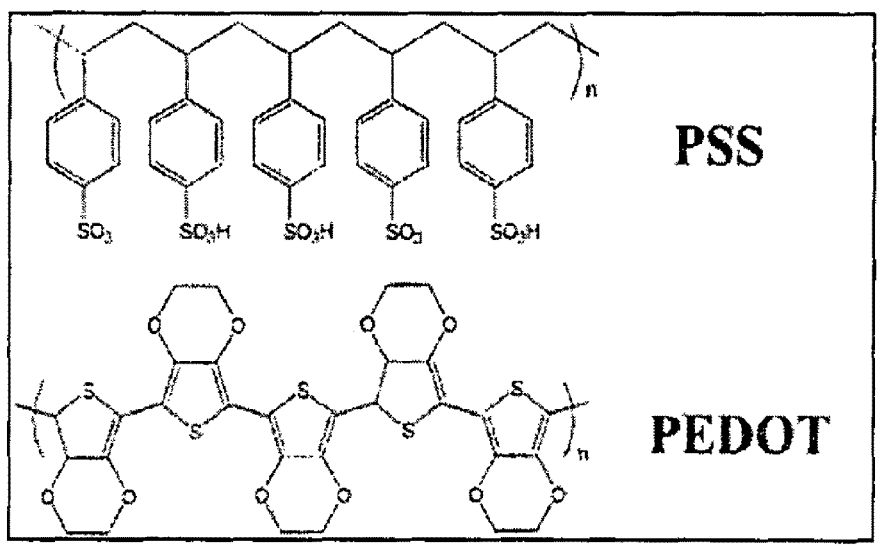

Due to conductivity and transparency of PEDOT:PSS film, it is used in many application areas such as electronic device (solar cell, sensor, memory, transistor, LED, diode etc.), medical, textile applications, photographic film, antistatic coating and printing technologies (FIG. 1).

In the electronic device applications, PEDOT:PSS is used as the layer which transports hole generally for improving the work function of indium tin oxide (ITO) and hole transportation in the structure.

Despite its many superior properties; a lot of studies are performed for improving morphologies, conductivities and stability of PEDOT:PSS films on the purpose of obtaining better application results in all areas where it is used. The studies of doping PEDOT:PSS film with different materials are the most important ones within the studies performed.

In these studies, PEDOT:PSS films are doped with different materials such as metal nanoparticles, carbon nanotubes, $WO_x$, $Fe_2O_3$, NPs, ethylene glycol (EG) and graphene etc.

One of the applications we have found during the literature search is the patent application with the publication number of CN104393175. In this application, ethylene glycol is added to the PEDOT:PSS layer of the organic solar cell.

However; even if these materials provide a little improvement in the morphology and conductivity of the film, the disadvantages it includes are being quite high cost, hard to be applied and having necessity of long time of the materials and techniques used.

Consequently; an improvement needs to be made in the related technical field with the production of PEDOT:PSS film because of the negativities mentioned above and insufficiency of the existing solutions regarding the subject matter.

THE PURPOSE OF THE INVENTION

The present invention is related to usage of boric acid in the production of PEDOT:PSS film which meets the needs mentioned above, eliminates all disadvantages and provides some additional advantages.

The main purpose of the invention is to dope PEDOT:PSS film which is used in the areas of electronic devices, medical, textile applications, photographic films, antistatic coatings and printing technologies with boric acid additive.

A purpose of the invention is that the production of PEDOT:PSS film comprising boric acid additive provides high efficiency, stability and low cost in comparison to the products used at the state of the art. Development of the products which have higher efficiency and stability is aimed via PEDOT:PSS films whose morphology and conductivity are improved with the addition of boric acid. PEDOT:PSS film may be coated on the plastic, glass, metal or metal oxide substrates. It is seen that boric acid doped PEDOT:PSS film coated on ITO substrate improves the surface morphology of ITO and increases its work function. The efficiency and stability of the ITO/PEDOT:PSS:$H_3BO_3$/Active layer/Metal structured solar cell produced by using boric acid doped PEDOT:PSS film on the purpose of determination of the effect of this improvement arising in ITO via the boric acid addition on the organic electronic applications increase. Performing these positive results with a cheap material is one of the most important advantages of this invention.

Another purpose of the invention is to provide that our country (Turkey) which has 72% of boron resources in the world benefits from this resource more by providing that boron compounds are included in all applications where PEDOT:PSS film is used.

To achieve the purposes described above, it is a production method of PEDOT:PSS film comprising the process steps of;
 a) Preparing substrate
 b) Preparing mixture of boric acid doped PEDOT:PSS
 c) Coating the prepared mixture of boric acid doped PEDOT:PSS on the substrate surface.

The structural and characteristic properties and all advantages of the invention are understood more clearly due to the figures given below and detailed description written by referring to these figures and that's why the evaluation also should be made by considering these figures and detailed description.

THE FIGURES WHICH HELP FOR UNDERSTANDING OF THE INVENTION

FIG. 1: It is the view of the molecular structure of PEDOT:PSS.

Figure 2:
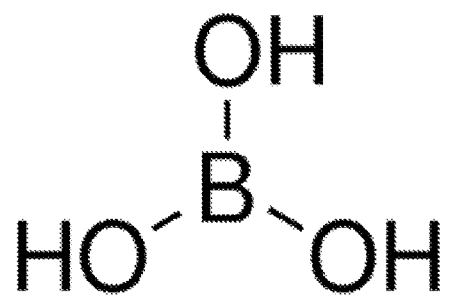

FIG. 2: It is the view of the molecular structure of boric acid.

Figures 3, 4:
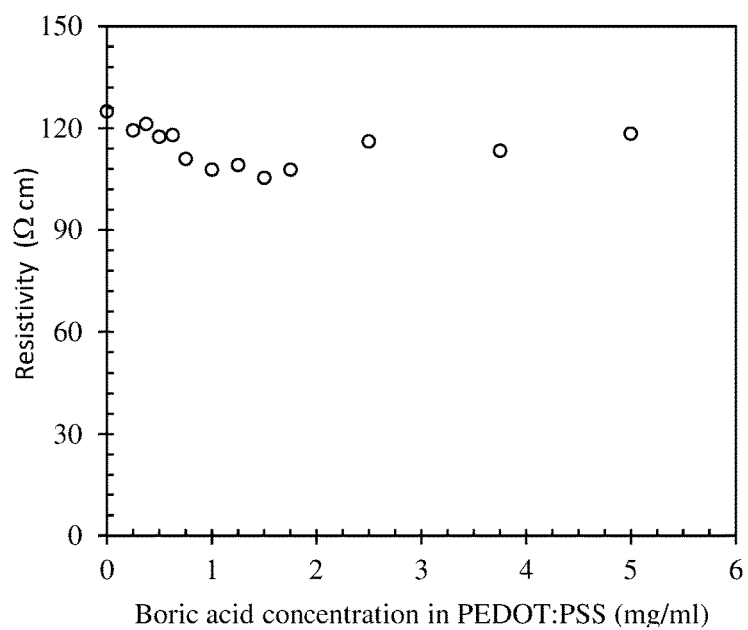

FIG. 3: It is the resistance change graph of PEDOT:PSS films without any additive and doped with boric acids having different concentrations.

FIG. 4: It is the view of schematic structure of the solar cells produced in a preferred body of the invention.

The figures do not need to be scaled certainly and unnecessary details for understanding of the present invention may be neglected. In addition; the elements which are at least significantly identical or have at least significantly identical functions are shown with the same number.

DETAILED DESCRIPTION OF THE INVENTION

In this detailed description; preferred body of the disclosed usage of boric acid in the production of PEDOT:PSS film of the invention are described only for better understanding of the invention such that it does not create any limiting effect.

The invention is the PEDOT:PSS film whose morphology, conductivity and stability are increased with higher efficiency, stability and low costs than PEDOT:PSS films produced at the state of the art by adding boric acid additive with different concentrations (preferred addition proportions are 0-5 mg/ml) to the PEDOT:PSS film.

To achieve the aims stated above, the process steps used for the production of boric acid doped PEDOT:PSS layer are as follows:

I) Preparing substrate,
(cleaning said substrate in the ultrasonic bath before coating)

II) Preparing the mixture of boric acid doped PEDOT:PSS (adding boric acid to the PEDOT:PSS solution of said PEDOT:PSS:H3B03 mixture)

III) Coating the mixture of boric acid doped PEDOT:PSS prepared on the substrate surface The mixture of boric acid doped PEDOT:PSS may be coated via one of the common methods like spin coating, dipping, casting, injecting, spraying, spreading or printing.

Said PEDOT:PSS film is used in many areas such as electronic devices, medical, textile, photographic film, antistatic coating and printing technologies.

IV) Performing characterization tests of the boric acid doped PEDOT:PSS films produced V) To achieve the aims stated above, producing electronic device comprising the boric acid doped PEDOT:PSS layer and performing its characterization tests The electronic device preferred in the invention is solar cell.

Boric acid is an industrial waste with very low cost which is obtained from boron minerals (FIG. 2). This waste is an important primary product in the boron sector and its production processes contribute significantly to the environmental effects.

It has been seen, at the measurements conducted on the purpose of determination of the effect of boric acid on the conductivity of PEDOT:PSS film (FIG. 3), that boric acid provides 5-20% increase in the conductivity of PEDOT:PSS film up to a certain concentration of boric acid (1.75 mg/ml).

The boric acid doped PEDOT:PSS film coated on ITO is used in the structure of solar cell in the work performed for determination of the effect of boric acid doped PEDOT:PSS film on the performance of the electronic device. As a result; it is seen that efficiencies of solar cells produced increase by 20% and the stability of the cells is more than the cells in which boric acid is not used. It is determined that this increase which arises in the device performance results from the fact that boric acid provides improvement in the work function and morphology of ITO. The structure of the solar cell produced is in the form of ITO/PEDOT:PSS:H$_3$BO$_3$/Active layer/Metal (FIG. 4).

A reference structure in which boric acid is not used is produced for determination of the effect of boric acid on the photovoltaic cell. The reference device structure is shown in the form of ITO/PEDOT:PSS/Active layer/Metal.

Current-voltage (I-V) characteristics are measured with Keithley 2400 power source under 100 mW/cm$^2$ (AM. 1.5 G) irradiation. The cell parameters calculated for determination of the effect of boric acid on the characteristics of the solar cell are given in Table 1.

TABLE 1

The photovoltaic parameters of the solar cells comprising buffer layer of PEDOT:PSS which comprises boric acid with different concentrations

| Concentration of boric acid in PEDOT:PSS (mg/ml) | $V_{oc}$ (Volt) | $J_{sc}$ (mA/cm$^2$) | FF | PCE % |
| --- | --- | --- | --- | --- |
| 0 | 0.535 | 8.75 | 38.3 | 1.79 |
| 0.625 | 0.525 | 8.00 | 36.5 | 1.53 |
| 1.25 | 0.602 | 7.57 | 46.9 | 2.14 |
| 2.50 | 0.612 | 6.37 | 45.8 | 1.78 |
| 3.75 | 0.620 | 7.00 | 42.2 | 1.83 |
| 5.00 | 0.640 | 5.10 | 39.0 | 1.27 |

As seen in Table 1, boric acid increases the efficiency of the cell by 20%. Also, it causes a significant increase in the open circuit voltage ($V_{oc}$) and fill factor (FF).

The subject PEDOT:PSS film of the invention can be used in military services, telecommunication, automated entrance control systems, medical equipment, antistatic coating, printing technologies, touchscreen, aircraft, ship and automotive industries. In these fields; it is applied as layer or coating for energy, illumination, highly stable and homogeneous coating systems.

The invention claimed is:

1. A production method of PEDOT:PSS film characterized by comprising process steps of;

a) Preparing substrate b) Preparing the mixture of boric acid doped PEDOT:PSS via adding boric acid (H$_3$BO$_3$) to the PEDOT:PSS mixture at a concentration of 0-5 mg/ml wherein the concentration is more than 0 mg/ml and wherein the concentration is less or equal to 5 mg/ml c) Coating the prepared mixture of boric acid doped PEDOT:PSS on the substrate surface.

2. The production method of PEDOT:PSS film according to claim 1 characterized in that in the process step b, boric acid (H$_3$BO$_3$) is added to the PEDOT:PSS mixture at a concentration of 0-1.75 mg/ml.

3. The production method of PEDOT:PSS film according to claim 2 characterized in that, in the process step b, boric acid (H$_3$BO$_3$) is added to the PEDOT:PSS mixture at a concentration of 1.25 mg/ml.

4. The production method of PEDOT:PSS film according to claim 1 characterized in that preparing substrate mentioned in the process step called "a" comprises a process step of:

Cleaning in the ultrasonic bath before coating.

* * * * *